(12) United States Patent
Koch

(10) Patent No.: US 8,604,577 B2
(45) Date of Patent: Dec. 10, 2013

(54) HYBRID SILICON VERTICAL CAVITY LASER WITH IN-PLANE COUPLING

(75) Inventor: Brian R. Koch, San Bruno, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/585,289

(22) Filed: Aug. 14, 2012

(65) Prior Publication Data
US 2013/0208752 A1 Aug. 15, 2013

Related U.S. Application Data

(62) Division of application No. 12/649,837, filed on Dec. 30, 2009, now Pat. No. 8,257,990.

(51) Int. Cl.
*H01L 31/0304* (2006.01)

(52) U.S. Cl.
USPC ................................. 257/432; 257/E31.019

(58) Field of Classification Search
None
See application file for complete search history.

(56) References Cited

U.S. PATENT DOCUMENTS

| | | | |
|---|---|---|---|
| 6,829,286 B1 | 12/2004 | Guilfoyle et al. | |
| 2006/0002443 A1* | 1/2006 | Farber et al. | 372/50.1 |
| 2007/0170417 A1 | 7/2007 | Bowers | |
| 2008/0002992 A1 | 1/2008 | Hochberg et al. | |
| 2008/0007817 A1 | 1/2008 | Hochberg et al. | |
| 2009/0245298 A1* | 10/2009 | Sysak et al. | 372/22 |
| 2009/0274411 A1* | 11/2009 | Bar et al. | 385/14 |

FOREIGN PATENT DOCUMENTS

| | | |
|---|---|---|
| JP | 10150242 | 6/1998 |
| JP | 11274638 | 10/1999 |

OTHER PUBLICATIONS

International Preliminary Report on Patentability for Application No. PCT/US2010/059320 dated Jul. 4,2012,5 pages.
Written Opinion of the International Searching Authority for Application No. PCT/US2010/059320 dated Sep. 28, 2011, 4 pages.
International Search Report for Application No. PCT/US2010/59320 dated Sep. 28, 2011, 3 pages.
Hybrid III-V and IV Lasers and Amplifiers by Bowers et al, ECOC 2007, Sep. 20, 2007, Paper 9.2.1, 4 pages.
Restriction Requirement for U.S. Appl. No. 12/649,837 dated May 13, 2011, 9 pages.
Office Action for U.S. Appl. No. 12/649,837 dated Aug. 1, 2011, 6 pages.
Final Office Action for U.S. Appl. No. 12/649,837 dated Nov. 28, 2011, 9 pages.
Advisory Action for U.S. Appl. No. 12/649,837 dated Mar. 13, 2012, 3 pages.
Notice of Allowance for U.S. Appl. No. 12/649,837 dated May 3, 2012, 9 pages.

* cited by examiner

*Primary Examiner* — Seahvosh Nikmanesh
(74) *Attorney, Agent, or Firm* — Blakely, Sokoloff, Taylor & Zafman LLP

(57) ABSTRACT

A silicon vertical cavity laser with in-plane coupling comprises wafer bonding an active III-V semiconductor material above a grating coupler made on a silicon-on-insulator (SOI) wafer. This bonding does not require any alignment, since all silicon processing can be done before bonding, and all III-V processing can be done after bonding. The grating coupler acts to couple the vertically emitted light from the hybrid vertical cavity into a silicon waveguide formed on an SOI wafer.

20 Claims, 2 Drawing Sheets

HYBRID SILICON VERTICAL CAVITY LASER WITH IN-PLANE COUPLING

CLAIM OF PRIORITY

This divisional application is a divisional of, and claims priority to, the U.S. utility application titled "Hybrid Silicon Vertical Cavity Laser with In-Plane Coupling," filed on Dec. 30, 2009, having an application Ser. No. 12/649,837, now U.S. Pat. No. 8,257,990 B2, issued Sep. 4, 2012, the entire contents of which are incorporated herein by reference.

TECHNICAL FIELD

Embodiments of the present invention are directed to vertical cavity lasers and, more particularly, to hybrid silicon/III-V vertical cavity laser structures for use in in-plane, waveguide based photonic integrated circuits.

BACKGROUND

Although silicon is an excellent material for guiding light and can detect and modulate light at high data rates, it has not yet been capable of efficiently generating large amounts of light. Silicon may be an inefficient light emitter because of a fundamental limitation called an indirect bandgap. An indirect bandgap prevents the atoms in silicon from emitting photons in large numbers when an electrical charge is applied. Instead, silicon tends to emit heat.

One approach to generate light on a silicon material is the so-called hybrid silicon evanescent platform. Indium Phosphide is one of a few special materials, including Gallium Arsenide, which emits energy as a photon of light when voltage is applied. Both materials may be used to make laser diodes, and are referred to as 'III-V materials' on the Periodic Table of elements because they share similar characteristics.

The hybrid silicon evanescent platform approach involves using wafer bonding to fix in place a III-V semiconductor material capable of emitting light above a silicon-on-insulator (SOI) wafer which is used for guiding the light. With the proper silicon waveguide design, light that is generated in the III-V material by current injection is automatically coupled into the silicon waveguide and laser light is efficiently coupled to the silicon waveguides. Several examples of these lasers have been demonstrated and their merits are now well-accepted.

However, there are some inherent disadvantages of these lasers due to their in-plane structure. To date, in-plane lasers have not demonstrated the high wall-plug efficiencies (i.e. overall energy efficiency) of vertical cavity surface emitting lasers (VCSELs). Vertical cavity lasers also have inherently higher direct modulation bandwidths with lower modulation powers. The advantages of the VCSEL result from the very low threshold currents that are possible for vertical cavity lasers, and this may be due to a combination of effects including the short cavity length and high electric field overlap with the quantum well (gain) material. If VCSELs are used, there are other problems such as alignment issues. Current methods involve die bonding individual VCSELs above silicon or coupling lasers in from the edge of a silicon chip. Both methods are time consuming and require sensitive alignment techniques.

FIG. 1 is a graph showing simulated and experimental threshold current for VCSELs with different reflectivity products for the front and back minors. Although results may also vary depending on the exact material used to form the laser active section, it is clear that very low thresholds can be attained, and this has been demonstrated experimentally. Thresholds below 1 mA are routinely obtained today.

BRIEF DESCRIPTION OF THE DRAWINGS

The foregoing and a better understanding of the present invention may become apparent from the following detailed description of arrangements and example embodiments and the claims when read in connection with the accompanying drawings, all forming a part of the disclosure of this invention. While the foregoing and following written and illustrated disclosure focuses on disclosing arrangements and example embodiments of the invention, it should be clearly understood that the same is by way of illustration and example only and the invention is not limited thereto.

DETAILED DESCRIPTION

Described is a VCSEL-like laser on silicon. By combining the high efficiency and modulation bandwidth of vertical cavity lasers with the light guiding, multiplexing, detecting, and modulating capabilities of in-plane silicon photonics advantages may be obtained.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
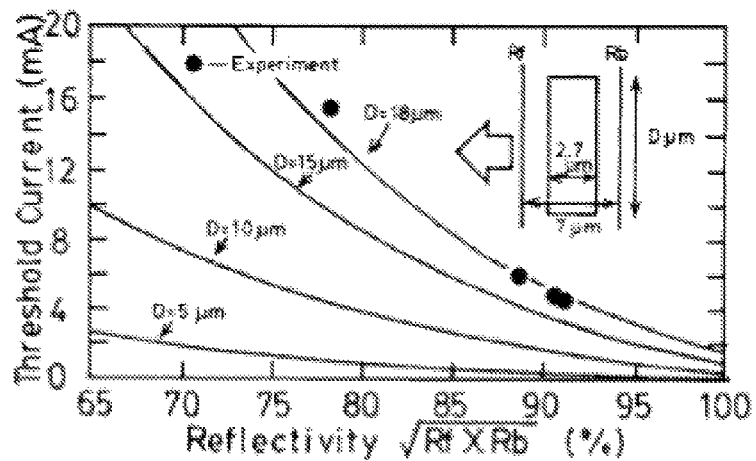
FIG. 1 is a graph showing simulated and experimental data for threshold current of VCSELs with different reflective mirror properties.
Figure 2:
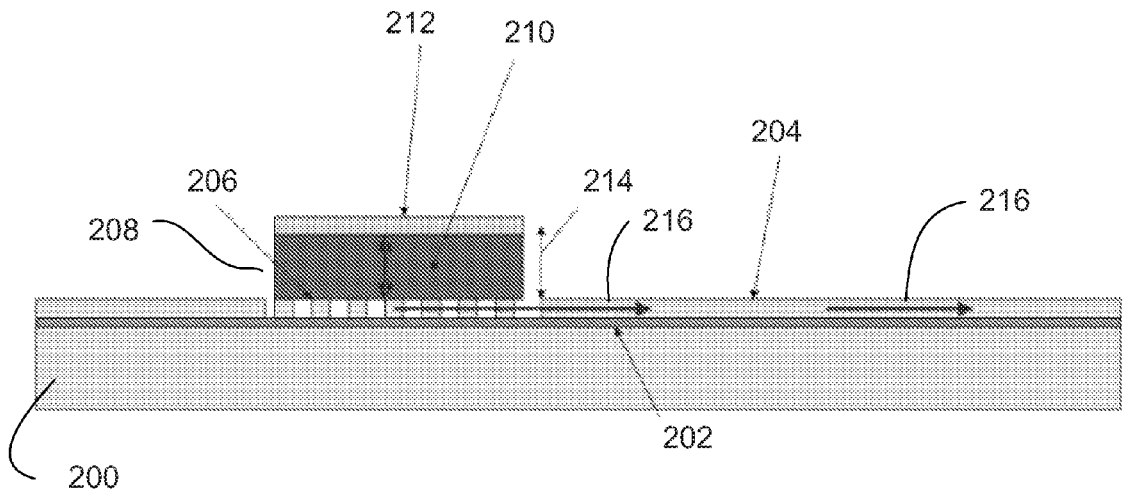
FIG. 2 is a side view of a hybrid vertial cavity laser coupled to an in-plane silicon waveguide according to one embodiment of the invention.

Referring now to FIG. 2, embodiments of the invention involve wafer bonding an active III-V semiconductor material above a grating coupler made on a silicon-on-insulator wafer. As shown an SOI wafer 200 comprises a buried oxide layer 202. A passive silicon waveguide 204 is fashioned on top of the buried oxide layer 202. A metal or SIO grating coupler 206 is fashioned on the buried oxide layer 202 on a lateral plane with the silicon waveguide 204. According to embodiments, an active III-V semiconductor material, forming a laser structure 208 may be bonded above the grating coupler 206. The laser 208 comprises a III-V active material 210. A top mirror 212 may be a reflective metal or also a III-V material and may reflect greater than 99% of generated light back into the laser cavity 214.

The laser 208 may be bonded to the substrate 200. The bonding step does not require any alignment, since all silicon processing can be done before bonding, and all III-V processing can be done after bonding, including removal of III-V material in undesired areas. The II-V semiconductor material may be any number of compounds, and may be chosen to emit light at wavelengths ranging from 1300 nm to 1600 nm or higher. Of course other wavelengths are possible as this may also be useful in the 980 nm range. The bonding may be performed using oxide bonding or bisbenzocyclobutene (BCB) bonding, for example. One advantage of this device is that the interface thickness does not affect the lasing performance as much as it can with traditional evanescent in-plane device.

The vertical cavity laser 208 is then made above the grating coupler 206 using standard III-V processing techniques. The top minor 212 may either be formed using a metal coating reflector or a distributed Bragg reflector grown as part of the III-V material epistructure. The lower mirror is formed by the grating coupler 206 itself, which can be designed to provide a specific reflectivity. The grating 206 sends some of vertical laser light horizontally into silicon waveguide 204 and reflects the rest back up to form the laser cavity 214. Thus, the grating coupler 206 also acts to couple the vertically emitted light from the hybrid vertical cavity 214 into a silicon waveguide 204 formed on the SOI wafer 200. The grating mirror 206 may be a high index contrast grating made from air on silicon or $SiO_2$ on silicon or a metal grating.

The arrows 216 show the path taken by the light. Because the modal overlap is so large and the cavity length 214 is so short, this laser may have lower threshold, higher efficiency, lower direct modulation RF power, and better modulation bandwidth than in-plane distributed feedback lasers. Since it is coupled to in-plane waveguides 204, it may still be used for on chip modulation, wavelength division multiplexing, etc.

Figure 3:
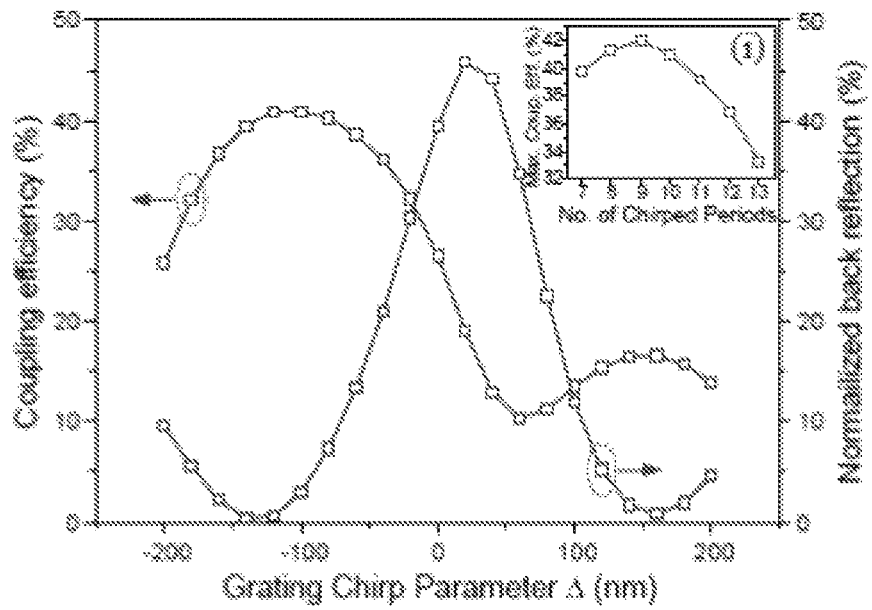
FIG. 3 is a graph showing normalized back reflection (on the right axis) for different chirp parameter gratings.

FIG. 3 shows the reflectivity for different chirp parameters for a SOI grating coupler. Although the maximum reflectivity shown for this particular design is only ~45%, much higher reflectivities may be obtained by changing the design. The design shown in the graph was chosen to minimize reflections. Alternatively, instead of relying on the grating coupler to provide all of the back reflection, an additional bottom minor may also be made by a distributed Bragg reflector in the III-V epistructure, or by a second grating placed after the grating coupler in the silicon waveguide. By using different grating designs, or by quantum well intermixing, or by using different length laser cavities, this technique may be used to form arrays of lasers that can then be wavelength division multiplexed on a single SOI chip.

Figure 4:
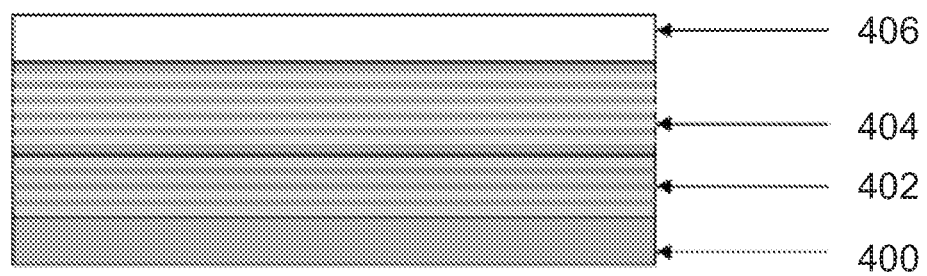
FIG. 4 is a cross-sectional view of an example epistructure of a III-V material used for a laser according to one embodiment.

FIG. 4 shows one example epistructure of the III-V material used in the laser 208. The laser 208 may comprise of an n-contact layer 400, which could also include a Distributed Bragg Reflector (DBR) structure to act as one of the minors, an optional superlattice layer 402, which may be used protect the quantum wells from strain during bonding, a quantum well layer 404 that generates the laser light, and a p contact layer 406, which also may include a DBR structure. The silicon epistructure is a standard SOI wafer.

It should be noted that this same concept and basic structure can be used to make vertical photodetectors and vertical electroabsorption modulators as well. For example, in FIG. 2, the laser structure 208 may also be a photo-detector or modulator. For a vertical cavity electroabsorption modulator, light would be coupled up from the waveguides on the chip using a grating coupler into the electroabsorption material placed above the coupler, and then coupled out of the chip to a vertically aligned fiber. The vertical photodetector could either detect light from a vertically aligned fiber above the chip, or detect light coupled up from the waveguide using a grating coupler.

Embodiments of the present invention are much more highly scalable than die bonding individual VCSELs above silicon waveguides one at a time. The invention uses wafer bonding, which does not require active alignment and can be incorporated into the back end of a CMOS process. For these reasons it is highly scalable. For example, thousands of lasers may be made and placed simultaneously from one bonding step. Compared to silicon evanescent in-plane lasers this method is expected to result in lower threshold currents, higher efficiencies, and higher modulation bandwidths. The lasers may be less sensitive to the bonding quality at the silicon/III-V interface and any fluctuations in the silicon waveguide dimensions. In theory this technique requires less III-V semiconductor material than silicon evanescent lasers.

Embodiments may be used in place of silicon evanescent lasers for applications requiring high efficiency lasers. These may include optical interconnects for chip-network, chip-chip, or on chip. They may be capable of direct modulation with very low RF powers compared to waveguide lasers or external silicon Mach-Zehnder modulators.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. An apparatus, comprising:
   a silicon on insulator (SOI) substrate;
   a silicon waveguide on the SOI substrate;
   a grating coupler fabricated on the silicon waveguide; and
   a vertically oriented III-V semiconductor device bonded to the SOI substrate above the grating coupler, wherein the grating coupler is to couple vertically oriented light to, or from, the III-V semiconductor device laterally from, or to, horizontally oriented light propagated by the silicon waveguide.

2. The apparatus as recited in claim 1 the vertical III-V semiconductor device comprises:
   an n-contact layer;
   a p-contact layer; and
   a quantum well layer comprising a III-V semiconductor material disposed between the n-contact layer and p-contact layer.

3. The apparatus as recited in claim 2, wherein the vertical III-V semiconductor device further comprises:
   a superlattice layer between the quantum well layer and the n-contact layer to protect the quantum well layer during bonding.

4. The apparatus as recited in claim 2 wherein the n-contact layer comprises a distributed Bragg structure.

5. The apparatus as recited in claim 2 wherein the p-contact layer comprises a distributed Bragg structure.

6. The apparatus as recited in claim 1 wherein the vertical III-V semiconductor device is a vertical cavity surface emitting laser (VCSEL) and emits light at wavelengths greater than 980 nm, and wherein the grating coupler is to couple vertically oriented light from the VCSEL into the waveguide.

7. The apparatus of claim 6, wherein a top one of the n-contact and the p-contact layer comprises a metal coating reflector or distributed Bragg structure, and wherein the grating coupler serves as a lower mirror of the VCSEL to send a first portion of vertical laser light horizontally into the silicon waveguide and reflect a second portion of the vertical laser light back up into a cavity of the VCSEL.

8. The apparatus as recited in claim 7, further comprising an additional bottom mirror comprising a distributed Bragg reflector in the III-V device structure.

9. The apparatus as recited in claim 7, further comprises a second grating disposed in the silicon waveguide after the grating coupler to reflect some of the a first portion of vertical laser light back up into the cavity of the VCSEL.

10. The apparatus of claim 7, wherein the grating coupler comprises a grating of at least one of: air on silicon, $SiO_2$ on silicon, or metal.

11. The apparatus of claim 8, wherein the grating coupler comprises a grating of a silicon layer of the SOI wafer on a lateral plane with the silicon waveguide.

12. The apparatus as recited in claim 11 wherein the III-V semiconductor device is a bonded to the SOI substrate with bisbenzocyclobutene (BCB) bonding.

13. The apparatus as recited in claim 1 wherein the III-V semiconductor device comprises a photodetector to detect light coupled up from the waveguide by the grating coupler.

14. The apparatus as recited in claim 1 wherein the III-V semiconductor device comprises a vertical cavity electroabsorption modulator to modulate light coupled up from the waveguide by the grating coupler.

15. An integrated photonics chip comprising:
a silicon on insulator (SOI) chip;
a silicon waveguide on the SOI chip; and
an array of vertical cavity surface emitting lasers (VCSELs) comprising a III-V semiconductor bonded to the SOI chip; and
a plurality of grating couplers fabricated on SOI chip disposed, wherein each grating coupler is disposed below each of the VCSELs to couple vertically oriented light from the VCSEL into the waveguide.

16. The integrated photonics chip of claim 15, wherein each VCSEL comprises
an n-contact layer;
a quantum well layer comprising a III-V semiconductor material over the n-contact layer; and
a p-contact layer over the quantum well layer, wherein the p-contact layer comprises a metal coating reflector or distributed Bragg structure, and wherein the grating coupler serves as a lower mirror of the VCSEL to send a first portion of vertical laser light horizontally into the silicon waveguide and reflect a second portion of the vertical laser light back up into a cavity of the VCSEL.

17. The integrated photonics chip of claim 15, further comprising a second grating disposed in the silicon waveguide after the grating coupler to reflect some of the a first portion of vertical laser light back up into the cavity of the VCSEL.

18. The integrated photonics chip of claim 15, wherein the VCSEL further comprises an additional bottom mirror comprising a distributed Bragg reflector.

19. The integrated photonics chip of claim 15, wherein the grating coupler comprises a grating of at least one of: air on silicon, $SiO_2$ on silicon, or metal.

20. The integrated photonics chip of claim 15, further comprising a wavelength division multiplexer disposed on the SOI chip.

* * * * *

UNITED STATES PATENT AND TRADEMARK OFFICE
CERTIFICATE OF CORRECTION

| | | |
|---|---|---|
| PATENT NO. | : 8,604,577 B2 | Page 1 of 1 |
| APPLICATION NO. | : 13/585289 | |
| DATED | : December 10, 2013 | |
| INVENTOR(S) | : Koch | |

It is certified that error appears in the above-identified patent and that said Letters Patent is hereby corrected as shown below:

Specification

Please insert in column 1, line 4 before CLAIM OF PRIORITY:

--STATEMENT OF GOVERNMENT INTEREST

This invention was made with Government support under contract number H98230-08-3-0011 awarded by the Department of Defense. The Government has certain rights in this invention.--

Signed and Sealed this
First Day of December, 2015

Michelle K. Lee
*Director of the United States Patent and Trademark Office*